(12) United States Patent
Su

(10) Patent No.: US 11,887,958 B2
(45) Date of Patent: Jan. 30, 2024

(54) COPLANAR BUMP CONTACTS OF DIFFERING SIZES

(71) Applicant: STMICROELECTRONICS LTD, Kowloon (HK)

(72) Inventor: Cheng-Yang Su, Hukou Township (TW)

(73) Assignee: STMICROELECTRONICS LTD, Kowloon (HK)

( * ) Notice: Subject to any disclaimer, the term of this patent is extended or adjusted under 35 U.S.C. 154(b) by 0 days.

(21) Appl. No.: 17/403,752

(22) Filed: Aug. 16, 2021

(65) Prior Publication Data
US 2022/0059486 A1 Feb. 24, 2022

Related U.S. Application Data

(60) Provisional application No. 63/068,291, filed on Aug. 20, 2020.

(51) Int. Cl.
*H01L 23/00* (2006.01)

(52) U.S. Cl.
CPC .............. *H01L 24/14* (2013.01); *H01L 24/11* (2013.01); *H01L 2224/11462* (2013.01); *H01L 2224/1403* (2013.01); *H01L 2224/1405* (2013.01)

(58) Field of Classification Search
CPC ...................... H01L 24/14; H01L 24/11; H01L 2224/11462; H01L 2224/1403; H01L 2224/1405; H01L 23/3192; H01L 24/05; H01L 24/16; H01L 24/32; H01L 2224/0401; H01L 2224/05572; H01L 2224/13082; H01L 2224/1411; H01L 2224/16235
See application file for complete search history.

(56) References Cited

U.S. PATENT DOCUMENTS

| 5,641,946 A | 6/1997 | Shim |
| 6,415,974 B2 | 7/2002 | Jao |

(Continued)

FOREIGN PATENT DOCUMENTS

JP 2012015468 A 1/2012

OTHER PUBLICATIONS

Hsu et al., "Singular Uniformity after Reflow of Varied-Shaped Flip Chip Solder Bump on Single Substrate," National Taipei University of Technology and National Taiwan University, 2006, 7 pages.

*Primary Examiner* — Douglas W Owens
(74) *Attorney, Agent, or Firm* — Seed IP Law Group LLP

(57) ABSTRACT

A die including a first contact with a first shape (e.g., ring-shaped) and a second contact with a second shape (e.g., cylindrical shaped) different from the first shape. The first contact has an opening that extends through a central region of a surface of the first contact. A first solder portion is coupled to the surface of the first contact and the first solder portion has the first shape. A second solder portion is coupled to a surface of the second contact and the second solder portion has the second shape. The first solder portion and the second solder portion both have respective points furthest away from a substrate of the die. These respective points of the first solder portion and the second solder portion are co-planar with each other such that a standoff height of the die remains consistent when coupled to a PCB or an electronic component.

18 Claims, 10 Drawing Sheets

(56) References Cited

U.S. PATENT DOCUMENTS

| | | | |
|---|---|---|---|
| 6,443,351 B1 | 9/2002 | Huang et al. | |
| 6,719,185 B2 | 4/2004 | Suzuki | |
| 2014/0048797 A1* | 2/2014 | Yu | H01L 29/41733 |
| | | | 257/66 |
| 2014/0319680 A1* | 10/2014 | Choi | H01L 24/97 |
| | | | 257/737 |
| 2016/0372436 A1* | 12/2016 | Cheng | H01L 24/05 |
| 2021/0057365 A1* | 2/2021 | Kuo | H01L 24/11 |
| 2021/0098405 A1* | 4/2021 | Chu | H01L 23/3192 |
| 2021/0098409 A1* | 4/2021 | Chen | H01L 24/13 |
| 2021/0111136 A1* | 4/2021 | Matsuura | H01L 24/13 |
| 2021/0125886 A1* | 4/2021 | Wang | H01L 23/49816 |
| 2021/0193518 A1* | 6/2021 | Aleksov | H01L 21/76838 |
| 2021/0193560 A1* | 6/2021 | Cardwell | H01L 24/33 |
| 2021/0272921 A1* | 9/2021 | Arifeen | H01L 24/05 |

* cited by examiner

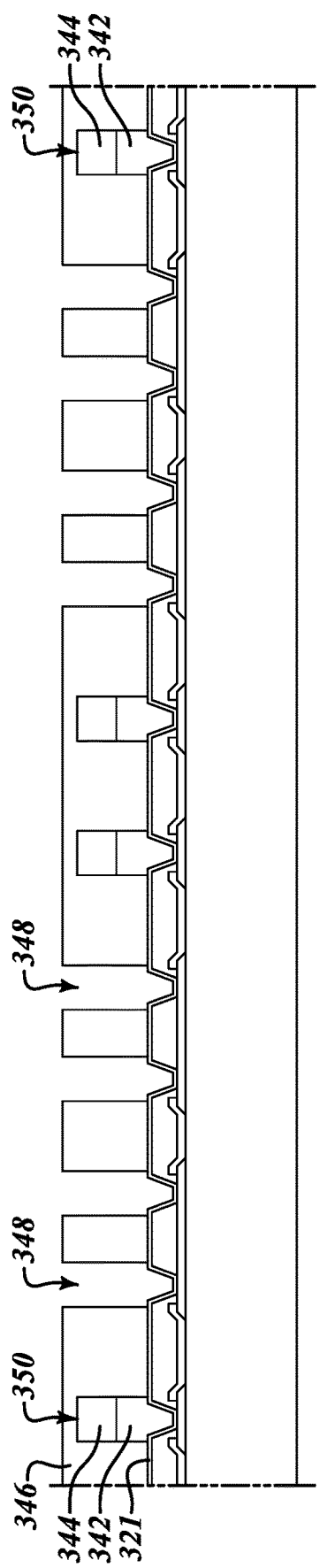
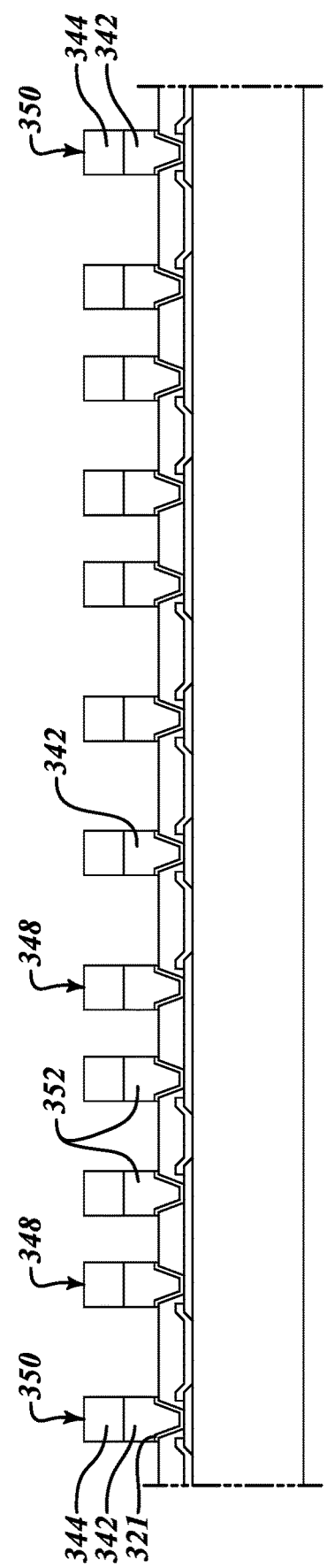

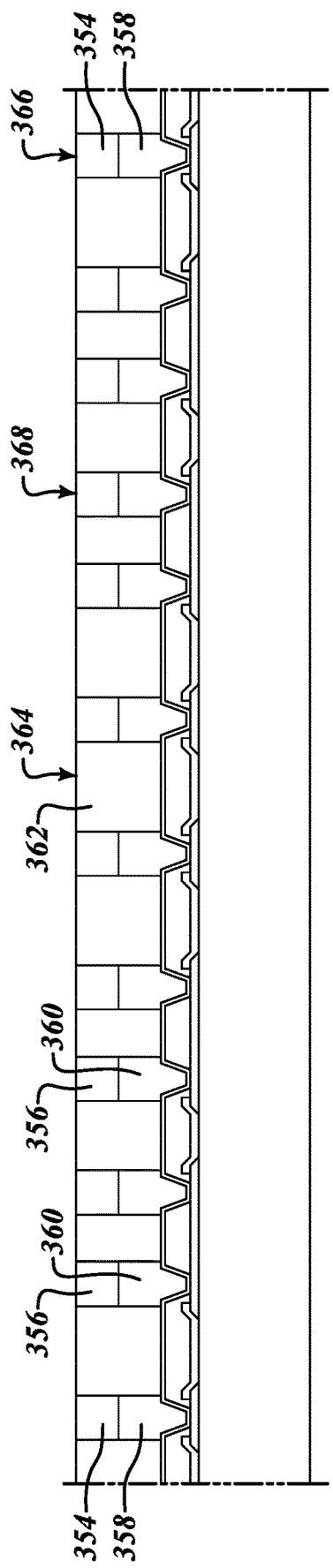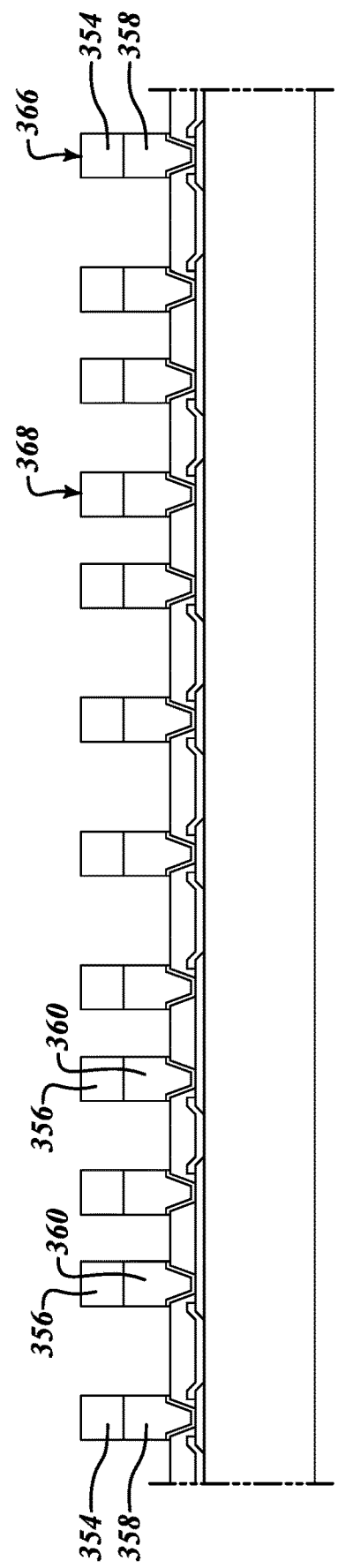

COPLANAR BUMP CONTACTS OF DIFFERING SIZES

BACKGROUND

Technical Field

The present disclosure is directed to conductive contacts and structures on a surface of a die.

Description of the Related Art

Generally, semiconductor device packages, such as chip scale packages or wafer level chip scale packages (WLCSP), contain semiconductor devices, semiconductor dice, or integrated circuit die. These may be sensors configured to detect any number of quantities or qualities or controllers utilized to control various other electronic components. For example, such semiconductor device packages may detect light, temperature, sound, pressure, stress, strain, or any other quantiles or qualities.

A semiconductor device package may be formed utilizing a flip chip technique in which a semiconductor die is flipped by a pick and place machine and is then mounted to a printed circuit board (PCB) by the pick and place machine after being flipped. The semiconductor die may be coupled to the PCB by solder balls. These solder balls are generally all the same size and there is no variation in shape or size. However, as semiconductor device packages become more advanced to perform ever increasingly complex functions, the requirement for various and differently sized solder bumps to couple a semiconductor die to a printed circuit board or mount a semiconductor die within a semiconductor device package is desirable.

A significant challenge to form solder bumps of differing and various sizes is achieving co-planarity between the solder bumps of differing and various sizes. If the solder bumps of differing and various sizes do not have points furthest away from a substrate of the die that are co-planar with each other, then the semiconductor die may be at an angle within the semiconductor device package or functional electrical connections may not be formed within a semiconductor device package.

Another significant challenge of manufacturing ever increasingly advanced semiconductor device packages is forming solder bumps to form electrical connections that are robust enough to withstand stresses and strains that a semiconductor device package may be exposed to reduce the likelihood of cracking or failure in the solder portions. For example, when shipping or moving these conventional semiconductor device packages, if the solder portions are not robust enough, the solder portions may crack or break off during shipment of these conventional semiconductor device packages due to vibrational stresses, which results in the semiconductor device package to no longer function.

In conventional semiconductor die utilizing differing sized solder bumps, the differing sized solder bumps are not substantially co-planar with each other. This non-co-planarity between the different sized solder bumps results in the semiconductor die being at an angle with respect to a surface to which the semiconductor die is coupled. This may result in other components becoming misaligned within a semiconductor device package in which the die is part of to complete ever increasingly functions in a complex electronic device. This angle may cause electrical connections to crack and fail more readily within the semiconductor device package or the electronic device reducing the usable life span of the semiconductor device package and the electronic device as well.

In order to avoid the co-planarity issue with differing and various sized solder portions as discussed directly above, conventional semiconductor die generally include solder bumps that are all exactly the same size and are made of the same amount of solder such that the solder bumps all have the same volume as well.

BRIEF SUMMARY

Embodiments of the present disclosure overcome significant challenges associated with co-planarity issues between solder portions of various and differing sizes and shapes to form electrical connections as discussed above. One significant challenge is to form differing and various sized solder portions with points furthest away from a substrate of a semiconductor die that are co-planar with each other. This co-planarity allows for the semiconductor die in a semiconductor device package to not be at an angle within the semiconductor device package, and allows for each and every electrical connection to be formed with greater reliability when forming the semiconductor device package. This greater reliability increases the overall yield of usable semiconductor device packages when utilizing solder portions of differing and various sizes to position the semiconductor die within the semiconductor device package.

In one embodiment, a semiconductor die has some contacts that are ring-shape contacts with an opening that extends through a central region of each of the ring-shape contacts. By ring-shape it is meant that an exterior shape surrounds an interior shape (e.g., an exterior circle with a first diameter surrounding an interior circle with a second diameter that is less than the first diameter). The ring-shape contacts allow for ring-shape solder portions to be formed on surfaces of the ring-shape contacts. Some other contacts of the semiconductor die have a different shape (e.g., a cylindrical shape) than the ring-shape contacts, and solder bumps are formed on surfaces of these different shape contacts. However, the solder bumps on these different shape contacts and the ring-shape solder portions on the ring-shape contacts have points furthest away from a substrate of the semiconductor die such that these points are all co-planar with each other. This co-planarity means that when the semiconductor die is mounted, for example, to a surface of a PCB the semiconductor die is substantially parallel with the surface of the PCB and is not an angle with respect to the surface of the PCB. In other words, for example, when the semiconductor die is coupled to the surface of the PCB a standoff height between the semiconductor die and the surface of the PCB remains substantially the same at each and every point along the surface of the PCB. This allows for more robust electrical connections to be formed between the PCB and the semiconductor die where the electrical connections are exposed to a larger amount of stress or strain relative to other electrical connections between the PCB and the semiconductor die.

The co-planarity between the differing and various sized solder portions as discussed above, reduces the likelihood that an electrical connection is not formed between the PCB and the semiconductor die as well. For example, if the differing and various sized solder portions were not substantially co-planar with each other some of the electrical connections between the PCB and the semiconductor die may be much less reliable in communicating electrical signals to the semiconductor die through the PCB and the solder portions.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify similar elements or acts unless the context indicates otherwise. The sizes and relative proportions of the elements in the drawings are not necessarily drawn to scale. For example, some of these elements may be enlarged and positioned to improve drawing legibility.

FIG. 4A-4B show steps of an alternative embodiment of the method of manufacturing the embodiment of the die as shown in FIGS. 1A-1D; and FIGS. 5A-5B shows steps of an alternative embodiment of the method of manufacturing the embodiment of the die as shown in FIGS. 1A-1D.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The term "left," "right," "top," and "bottom" are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a package is manufactured in the real world, as nothing can be made perfectly equal or perfectly the same. In other words, substantially means that there may be some slight variation in actual practice and instead is made within accepted tolerances.

As used in this specification and the appended claims, the singular forms "a," "an," and "the" include plural referents unless the content clearly dictates otherwise.

While various embodiments are shown and described with respect to semiconductor die and semiconductor packages, it will be readily appreciated that embodiments of the present disclosure are not limited thereto. In various embodiments, the structures, devices, methods and the like described herein may be embodied in or otherwise utilized in any suitable type or form of semiconductor die or packages, and may be manufactured utilizing any suitable semiconductor die and packaging technologies as desired.

Figure 1A:
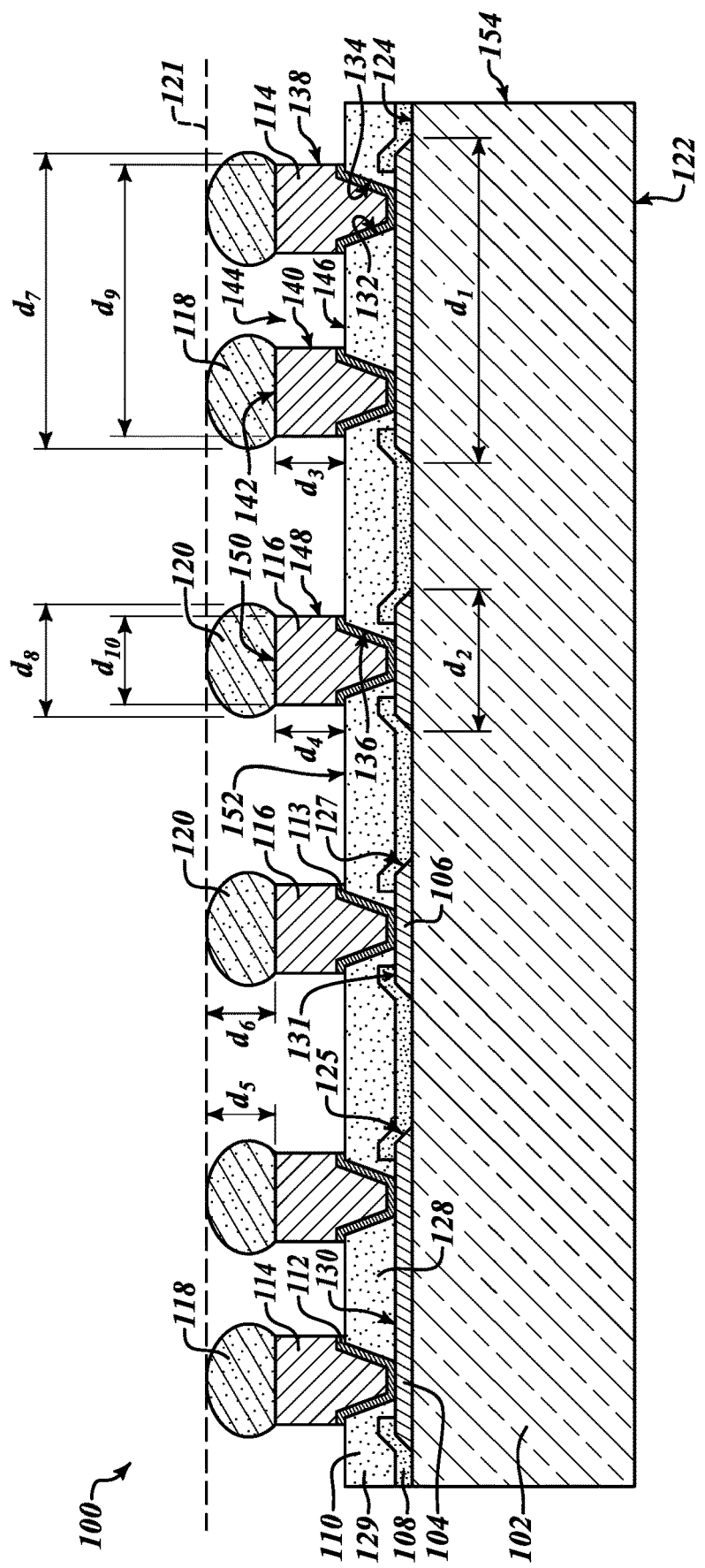
FIG. 1A is a cross-sectional view of an embodiment of a die taken along line 1A-1A in FIG. 1B.

FIGS. 1A-1D are directed to a die 100 according to an embodiment disclosed herein having different sized solder contacts that have a same height protruding outward from a substrate 102 of the die 100. FIG. 1A is a cross-sectional view of the die 100, which may be used for a plurality of different applications. For example, the die 100 may be a sensor (e.g., a pressure sensor, a temperature sensor, a vibrational sensor, a MEMS sensor, etc.), an integrated circuit (e.g., an application-specific integrated circuit (ASIC), a substrate having active components within, etc.), or some other type of die or integrated circuit. The die 100 includes the substrate 102, a first contact pad 104, a second contact pad 106, a first nonconductive layer 108, a second non-conductive layer 110, a first conductive layer 112, a second conductive layer 113, a first conductive structure 114, a second conductive structure 116, a first solder portion 118, and a second solder portion 120.

The first conductive structure 114 has a ring-shape and the first solder portion 118 is on the first conductive structure 114. The first solder portion 118 has the ring-shape. The ring includes an exterior surface 138 which may be referred to as a first round or circular wall that is concentric with an interior surface 140 which may be referred to as a second round or circular wall. A center of the first conductive structure 114 is open at an opening 144, i.e. does not include conductive material. The first circular wall 138 surrounds the second circular wall 140 when the die 100 is viewed in a bottom-plan view, which can be seen in FIGS. 1B-1D. The first conductive structure includes a surface 142 that extends from the exterior surface 138 to the interior surface 140. The surface 142 is transverse to the exterior surface 138 and the interior surface 140. The surface 142 has the ring-shape and surrounds the opening 144.

An edge 143 at an end of the exterior surface 138 surrounds an edge 145 at an end of the interior surface 140, and the surface 142 of the conductive material of the conductive structure 114 extends between the edges 143, 145, i.e. the conductive material of the conductive structure 114 extends between the edges 143, 145. The edges 143, 145 are substantially circular. However, in some embodiments, the edges 143, 145 may have different shapes than each other or similar shapes as each other. For example, the edge 143 may be a square shape and the edge 145 may be an ovular shape such that the opening 144 is an ovular shape. Alternatively, the edge 143 may be rectangular and may surround the edge 145 which may have a circular shape such that the opening 144 has a circular shape. In other words, the edges 143, 145 may be some other combination of exterior and interior shapes.

The second conductive structure 116 is a pillar conductive structure and the second solder portion 120 is a solder ball on the second conductive structure 116. The second solder portion 120 may have a semi-spherical shape. The first solder portion 118 and the second solder portion 120 each have a point furthest away from the substrate 102 that are substantially coplanar with each other. These points of the solder portions 118, 120 are along a representative dotted line 121 that extends across the solder portions 118, 120. The advantages of this co-planarity between the solder portions 118, 120 utilizing different shaped and sized conductive structures 114, 116 and solder portions 118, 120 will be discussed in greater detail later herein.

The substrate 102 has a first surface 122 and a second surface 124 that is opposite to the first surface 122. The first surface 122 may be referred to as a passive surface, an outer surface, or some other language or reference to a surface of the substrate 102. The second surface 124 may be referred to as an active surface on which active components are present, a mounting surface, a contact surface, or some other language or reference to a surface of the substrate 102. The second surface 124 provides a platform on which the nonconductive layers 108, 110, the conductive layers 112, 113, the conductive structures 114, 116, and the solder portions 118, 120 are formed, respectively. In some embodiments, the substrate 102 may be a semiconductor material, a silicon material, a dielectric material, or some other substrate material or combination of substrate materials. In some embodiments, the substrate 102 may be made of multiple layers of semiconductor material, multiple layers of silicon material, multiple layers of dielectric material, or multiple layers of some other combination of substrate materials. For example, in some embodiments, the substrate 102 may be made of stacked layers of various combinations of materials such as semiconductor materials, dielectric materials, silicon materials, conductive materials, passivation materials, repassivation materials, or some other materials or combination of substrate materials.

The first contact pad 104 is on the second surface 124 of the substrate 102. The first contact pad 104 provides an electrical connection to electrical components within the substrate 102. While these electrical components are not shown for simplicity and brevity sake, the electrical components may be electrical vias, conductive layers, transistors, sources, gates, drains, or some other electrical component or combination of electrical components within the substrate 102. The first contact pad 104 has a dimension $d_1$ that extends between opposite ends 125 of the first contact pad 104. The first contact pad 104 may be one of a plurality of first contact pads 104 on the second surface 124.

The second contact pad 106 is on the second surface 124 of the substrate 102 and provides an electrical connection to the electrical components within the substrate 102 in the same fashion as the first contact pad 104 as discussed earlier. The second contact pad 106 is spaced apart from the first contact pad 114 and has a second dimension $d_2$ that extends between opposite ends 127 of the second contact pad 106. The second dimension $d_2$ is less than the first dimension $d_1$.

The second contact pad 106 may be one of a plurality of second contact pads 106 on the second surface 124.

The first nonconductive layer 108 is on the second surface 124 of the substrate 102. The first nonconductive layer 108 covers the ends 125, 127 of the first contact pad 104 and the second contact pad 106, respectively. The first nonconductive layer 108 is between the first contact pad 104 and the second contact pad 106 to electrically isolate the first contact pad 104 from the second contact pad 106. The first nonconductive layer 108 reduces the likelihood of electrical cross-talk between the first contact pad 104 and the second contact pad 106. Electrical cross-talk is when a signal passes directly from the first contact pad 104 to the second contact pad 106 and vice versa.

The second nonconductive layer 110 is on the first nonconductive layer 108 and a portion 128 of the second nonconductive layer 110 is on a surface 130 of the first contact pad 104. The portion 128 is aligned with a center of the surface 130 of the first contact pad 104 and may have a substantially circular shape, which can be seen in FIGS. 1B-1D. In some embodiments, the portion 128 may have a substantially square shape, a substantially rectangular shape, a substantially ovular shape, or some other shape or combination of shapes.

The first nonconductive layer 108 and the second nonconductive layer 110 may be a dielectric material, a passivation material, a repassivation material, an insulating material, or some other nonconductive material or combination of nonconductive materials.

The first conductive layer 112 extends through the second nonconductive layer 110 to the surface 130 of the first contact pad 104. The first conductive layer 112 is directly on and coupled to the surface 130 of the first contact pad 104. The first conductive layer 112 is positioned between the portion 128 of the second nonconductive layer 110 and the rest of the second nonconductive layer 110 such that the portion 128 is isolated, spaced apart, and separated from a second portion 129 of the second nonconductive layer 110. The first conductive layer 112 has a substantially ring-shape such that the first conductive layer 112 surrounds the portion 128 of the second nonconductive layer 110. The first conductive layer 110 covers a side surface 132 of the portion 128 of the second nonconductive layer 110, and the first conductive layer 110 covers a side surface 134 that is part of the second portion 129 of the second nonconductive layer 110. The side surface 134 surrounds the side surface 132 of the portion 128. The side surfaces 132, 134 are transverse to the second surface 124. The first conductive layer 112 may be a copper material, a gold material, a silver material, an alloy material, or some other conductive material or combination of conductive materials.

The second conductive layer 113 extends through the second nonconductive layer 110 to a surface 131 of the second contact pad 106. The second conductive layer 113 is directly on and coupled to the surface 131 of the second contact pad 106. The second conductive layer 113 covers a side surface 136 of the second nonconductive layer 110. The second conductive layer 113 and the side surface 136 have a substantially circular shape, which can be seen in FIGS. 1B-1D. The side surface 136 is transverse to the second surface 124 of the substrate 102. In some embodiments, the side surface 136 may have a substantially rectangular shape, a substantially square shape, a substantially ovular shape, or some other shape or combination of shapes.

Figure 1B:
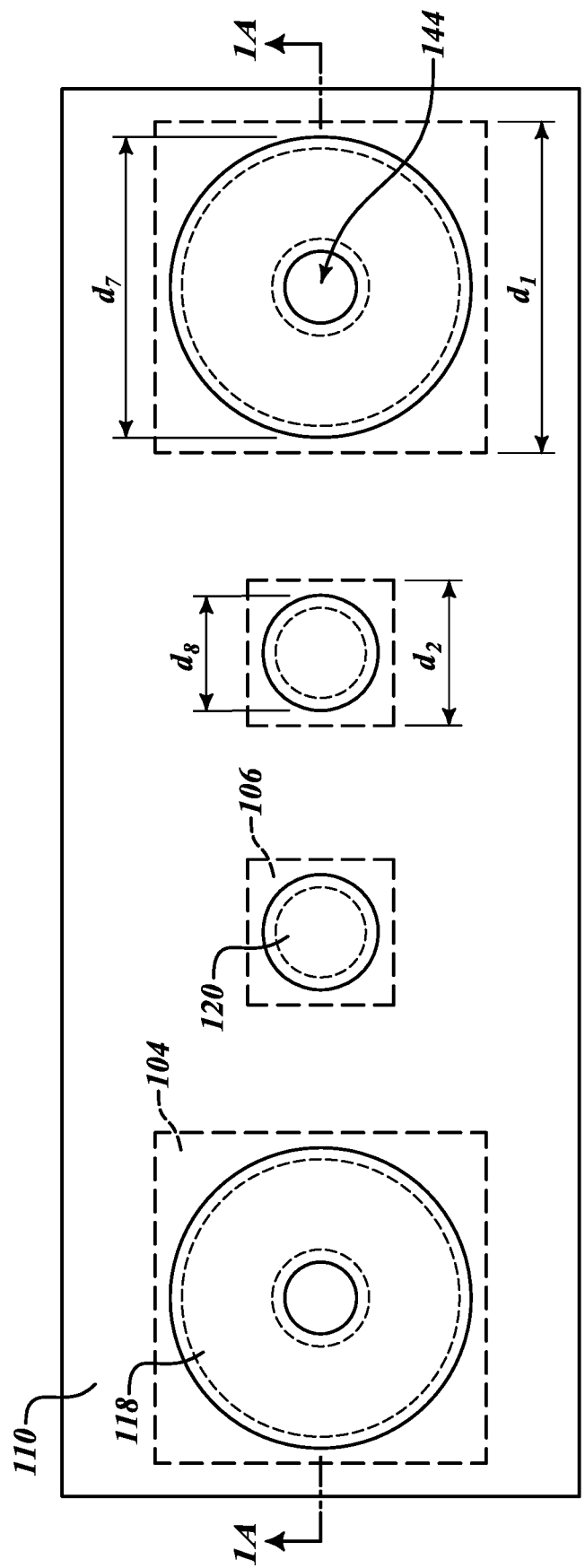
FIG. 1B is a bottom plan view of the embodiment of the die in FIG. 1A.

The first conductive structure 114 is on and coupled to the first conductive layer 112. The first conductive structure 114 and the first conductive layer 112 have substantially the same shape when viewed in the bottom-plan view as shown in FIG. 1B.

The first conductive structure 114 further includes an opening that extends into the first conductive structure 114 and exposes a surface 146 of the portion 128 of the second nonconductive layer 110. The opening 144 extends entirely through the first conductive structure 114 to the surface 146 of the portion 128. The opening 144 is surrounded by the interior surface 140 of the first conductive structure 114. The openings 144 are surrounded by the interior surface 140 of the first conductive structure 114 and the surface 146 of the portion 128 of the second nonconductive layer 110. The opening 144 has a substantially circular shape, which can be seen in FIGS. 1B-1D. In some embodiments, the opening 144 may have a substantially rectangular shape, a substantially square shape, a substantially ovular shape, or some other shape or combination of shapes.

The first conductive structure 114 has a dimension $d_3$ that extends from the surface 146 of the portion 128 of the second nonconductive layer 110 to the surface 142 of the first conductive structure 114.

The second conductive structure 116 has an exterior surface 148 and a surface 150 that is transverse to the exterior surface 148. The surface 150 is transverse to the exterior surface 148, which can be seen in FIG. 1C. The second conductive structure 116 covers the second conductive layer 113.

The second conductive structure has a dimension $d_4$ that extends from a surface 152 of the second portion 129 of the second nonconductive layer 110. The dimension $d_4$ is substantially equal to the dimension $d_3$.

The first solder portion 118 is on and coupled to the surface 142 of the first conductive structure 114. The first solder portion 118 has substantially the same shape as the first conductive structure 114 and the first conductive layer 112 as set forth earlier. The first solder portion 118 includes a dimension $d_5$ that extends from the surface 142 to a point of the first solder portion 118 furthest away from the surface 142 of the first conducive structure 114.

The second solder portion 120 is on and coupled to the surface 150 of the second conductive structure 116. The second solder portion 120 is a solder ball as set forth earlier. The second solder portion 120 includes a dimension $d_6$ that extends from the surface 150 to a point of the second solder portion 120 furthest away from the surface 150 of the second conductive structure 116. The dimension $d_6$ is substantially equal to the dimension $d_5$.

In view of the earlier discussion, the first conductive structure 114 and the first solder portion 118 will have substantially the same shape as the first conductive layer 112. For example, if the first conductive layer 112 has a ring-shape that is substantially circular, then the first conductive structure 114 and the first solder portion will have the ring-shape that is substantially circular of the first conductive layer 112.

In view of the earlier discussion, the second conductive structure 116 and the second solder portion 120 will have substantially the same shape as the second conductive layer 113. For example, if the second conductive layer 113 has a substantially circular shape, then the second conductive structure 116 and the second solder portion 120 will have the substantially circular shape of the second conductive layer 113.

In view of the earlier discussions with respect to the dimensions $d_3$, $d_4$, $d_5$, $d_6$ of the conductive structures 114, 116 and the solder portions 118, 120, the addition of the dimensions $d_3$ and $d_5$ is substantially equal to the addition of the dimensions $d_4$ and $d_6$. These additions being equal to one another allows each of the solder portions 118, 120 to have a respective point furthest away from the surface 124 of the substrate 102 to be substantially coplanar with each other.

The die 100 includes sidewalls 154 that may be made of the substrate 102, the first nonconductive layer 108, and the second nonconductive layer 110. The conductive layers 104, 106, 112, 113 are spaced inwardly from the sidewalls 154 to avoid exposing conductive features (e.g., electrical active components and passive components such as resistors, transistors, etc.) within the die 100.

FIG. 1B is the bottom-plan view of the die 100 as shown in FIG. 1A. FIG. 1B illustrates the substantially ring-shape of the first conductive structures 114 and the substantially circular shape of the second conductive structures 116.

The first solder portion 118 has a dimension $d_7$ that is substantially equal to the dimension $d_1$. The dimension $d_7$ is a diameter of the first solder portion 118. In some embodiments, the dimension $d_7$ may be less than the dimension $d_1$.

The second solder portion 120 has a dimension $d_8$ that is substantially equal to the dimension $d_2$. The dimension $d_8$ is a diameter of the second solder portion 120. In some other embodiments, the dimension $d_8$ may be greater than, substantially equal to, or less than the dimension $d_2$.

The first conductive structure 114 has a dimension $d_9$ that is less than the dimension $d_7$ and the dimension $d_1$. The dimension $d_9$ is a diameter of the first conductive structure 114. In some embodiments, the dimension $d_9$ may be substantially equal to or greater than the dimension $d_1$.

The second conductive structure 116 has a dimension $d_{10}$ that is less than the dimension $d_8$ and the dimension $d_2$. The dimension $d_{10}$ is a diameter of the second conductive structure 116. In some embodiments, the dimension $d_{10}$ may be substantially equal to or greater than the dimension $d_2$.

Figure 1D:
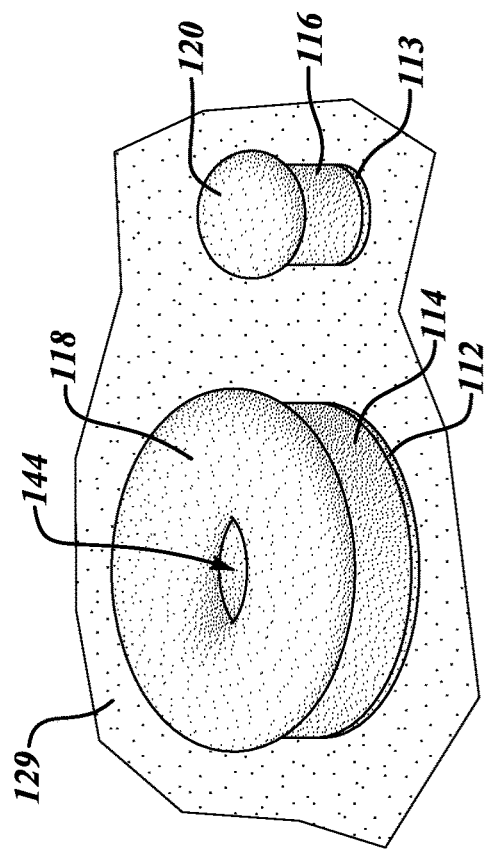
FIG. 1D is a perspective view of the embodiments of the surfaces of the first contact and the second contact of the die covered by a conductive material in FIGS. 1A-1C.
Figure 1C:
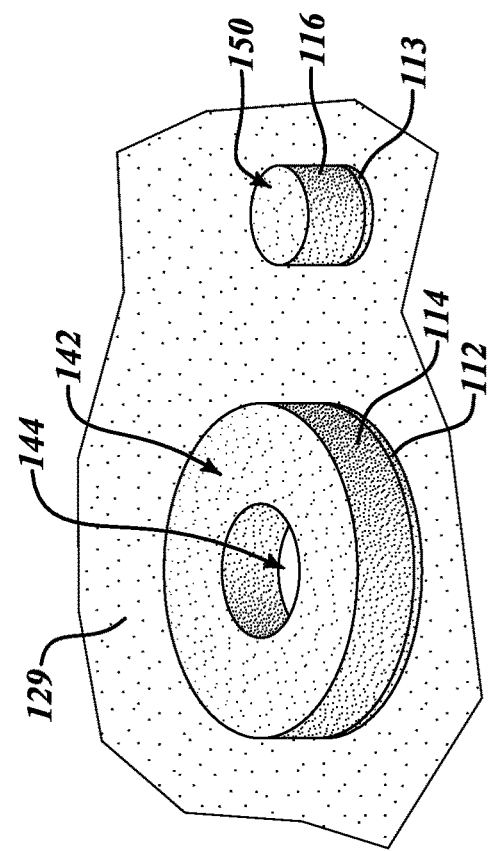
FIG. 1C is a perspective view of embodiments of surfaces of a first contact and a second contact of the die in FIGS. 1A-1B.

FIGS. 1C-1D are a zoomed in perspective view of one of the first conductive structures 114 and one of the second conductive structures 116 on the second surface 124 of the substrate 102.

Figure 2:
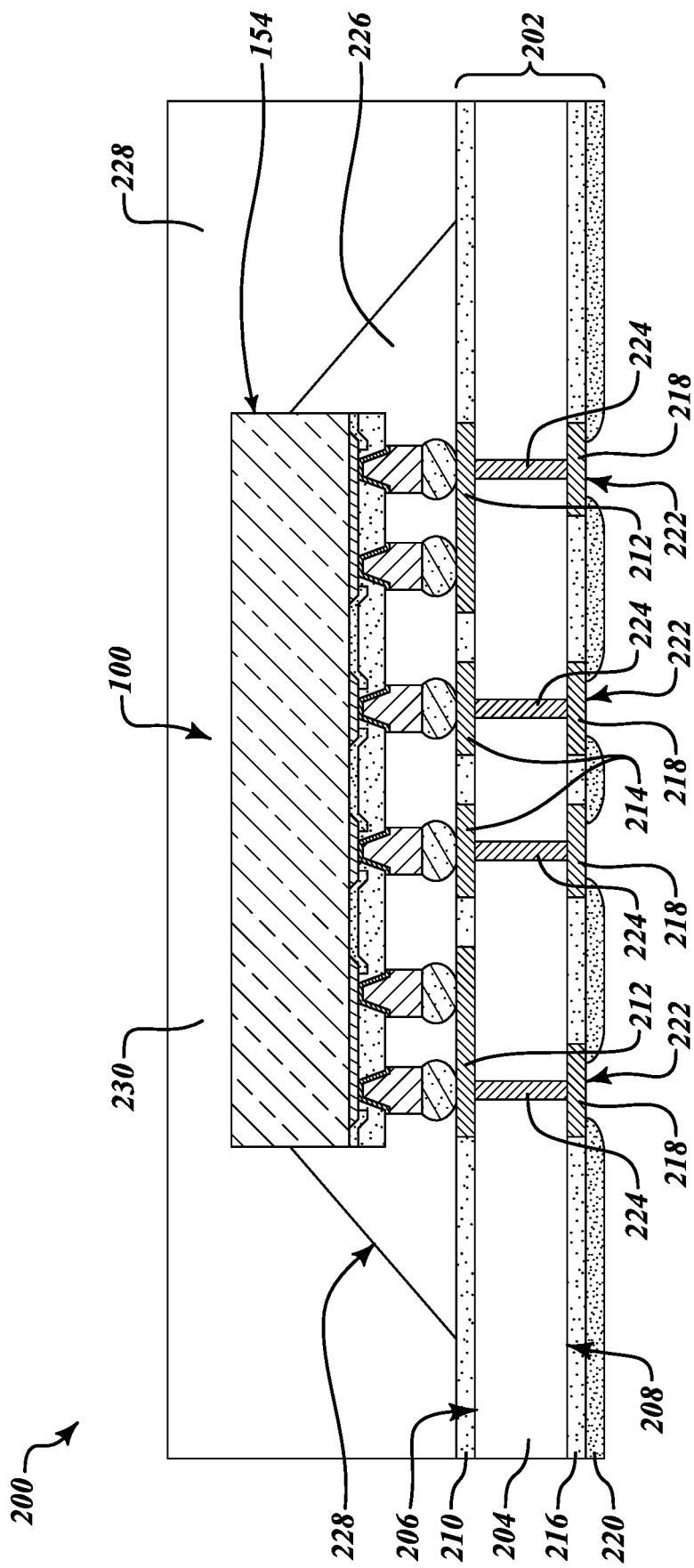
FIG. 2 is a cross-sectional view of an embodiment of a package including the embodiment of the die as shown in FIGS. 1A-1D.

FIG. 2 is a package 200 that incorporates the embodiment of the die 100 as shown in FIGS. 1A-1D. The die 100 may be attached to an electrical component 202 utilizing a flip chip technique. For example, the flip chip technique may utilize a pick and place machine that picks up the die 100, flips the die over, and then positions the die 100 onto the electrical component 202, which may be an application-specific integrated circuit (ASIC), a printed circuit board (PCB), a semiconductor die, or some other electrical component.

The electrical component 202 includes a substrate 204 with a first surface 206 and a second surface 208 opposite to the first surface 206. A first nonconductive layer 210, a plurality of first conductive layers 212, and a plurality of second conductive layers 214 are on the first surface 206. The substrate 204 may be a silicon material, a semiconductor material, or another substrate material or combination of substrate materials.

Each of the first solder portions 118 of the die 100 is coupled to a corresponding one of the first conductive layers 212. Each of the second solder portions 120 of the die 100 is coupled to a corresponding one of the second conductive layers 214.

The electrical component 202 further includes a second nonconductive layer 216, a plurality of third conductive layers 218, and a third nonconductive layer 220 on the second surface 208 of the substrate 204. The second nonconductive layer 216 surrounds each of the third conductive layers 218. The third nonconductive layer 220 is on the second nonconductive layer 216 and may be on and partially cover surfaces 222 of the third conductive layers 218. The third nonconductive layer 220 has openings 224 that expose the surfaces 222 of the third conductive layers 218.

A plurality of vias 224 are in and extend through the substrate 204 from the first surface 206 to the second surface 208. Some of the vias 224 couple each of the first conductive layers 212 to one of the third conductive layers 218, and some of the vias 224 couple each of the second conductive layers 214 to one of the third conductive layers 218. The first conductive layers 212, the second conductive layers 214, and the vias 224 form electrical connections that allow for signals to be communicated to and from the die 100 to external electrical components outside the package 200. The plurality of vias 224 may be through silicon vias (TSVs).

The first nonconductive layer 210 may be an insulating material, a dielectric material, or some other electrically nonconductive material or combination of electrically nonconductive materials. The first conductive layers 212 and the second conductive layers 214 may be made of a copper material, a gold material, a silver material, an alloy material, or some other electrically conductive material or combination of electrically conductive materials. The first conductive layers 212 and the second conductive layers 214 may be referred to as electrical contacts, electrical pads, electrical contact pads, or some other language or reference to an electrically conductive layer.

The electrical component 202 may be a printed circuit board (PCB), application-specific integrated circuit (ASIC) die, a controller die, or some other electrical component to which the die 100 is coupled.

A first epoxy 226 fills the openings 144 of the first conductive structures 114 as well as gaps that are between and separate the first conductive structures 114 and the second conductive structures 116. The first epoxy 226 electrically isolates each of the first conductive structures 114 and the second conductive structures 116 from each other to avoid electrical cross-talk between the conductive structures 114, 116. Electrical cross-talk being when signals pass between the first conductive structures 114 and the second conductive structures 116 directly with each other. The first epoxy 226 is on the second nonconductive layer 110. The first epoxy 226 partially covers the sidewalls 154 of the die 100. The first epoxy 226 includes a surface 228, which is inclined. In some embodiments, the surface 228 may be curved in either a concave or convex manner instead of inclined as shown in FIG. 2. The first epoxy 226 may be referred to as an underfill epoxy that is partially positioned between the electrical component 202 and the die 100.

A second epoxy 230 is on and covers the second surface 124 of the die 100, and covers the rest of the sidewalls 154 that are not covered by the first epoxy 226. The second epoxy 230 helps protect the die 100 from external stresses and forces that if exerted directly on the die 100 may result in failure of the die. For example, the die 100 being dropped, the die 100 being pressed on, or other stresses or external forces.

The first conductive layers 212, the second conductive layers 214, the third conductive layers 218, and the vias 224 may be made of a conductive material such as a copper material, an gold material, an alloy material, or some other conductive material or combination of conductive materials.

The first nonconductive layer 210, the second nonconductive layer 216, and the third nonconductive layer 220 may be a passivation material, a repassivation material, an insulating material, a dielectric material, or some other nonconductive material or combination of nonconductive materials.

The first epoxy 226 and the second epoxy 230 may be a molding compound material, an insulating material, a resin material, or some other nonconductive material or combination of nonconductive materials. In some embodiments, the first epoxy 226 may alternatively be an adhesive, a glue, a die attach film (DAF), or some other coupling material or combination of coupling materials. In some embodiments, the second epoxy 230 may not be present and there may only be the first epoxy which covers and fills spaces between the electrical component 202 and the die 100.

Generally, conventional semiconductor die may include a plurality of conductive structures that protrude outward from a surface of the conventional semiconductor die, and a plurality of solder bumps are coupled to surfaces of the conductive structures. These conventional conductive structures have all the same size, profile, and overall shape, and these conventional solder bumps have all the same size, profile, and overall shape as well. These conventional conductive structures and conventional solder bumps generally allow a standoff height, which is a distance between the conventional semiconductor die and a PCB or an ASIC die to which the conventional semiconductor die is coupled, to remain consistent along the conventional semiconductor die when coupled to the PCB or ASIC. The embodiments of the die 100 of the present disclosure, which is shown in FIGS. 1A-1D, has the first conductive structures 114 that have the substantially ring-shape and the second conductive structures 116 that are substantially circular shape (e.g., cylindrical). The die 100 further includes first solder portions 118 coupled to the first conductive structures 114 and second solder portions 120 coupled to the second conductive structures 116. The first solder portions 118 have the ring-shape and the second solder structures 120 are solder bumps. These different sized conductive structures 114, 116 and solder portions 118, 120 allow for a standoff height between the die 100 and a PCB or ASIC die to which the die 100 is coupled to remain consistent along the die 100 when coupled to the PCB.

However, unlike the conventional semiconductor die, the first conductive structures 114 and the first solder portions 118 of the die 100 allow for a larger amount of solder to be coupled to the PCB when compared to the second conductive structures 116 and the second solder portions 120 of the die 100. This larger contact formed between the first conductive structures 114, the first solder portions 118, and the PCB allow for a stronger cohesive bond between the PCB and the die 100 at the locations of the first conductive structures 114 when compared to the second conductive structures 116 and the second solder portions 120. The larger contact formed by the first conductive structures 114 and the first solder portions 118 also provides for greater electrical communication or stronger electrical communication when compared to the second conductive structures 116 and the second solder portions 120. Accordingly, the first conductive structures 114 may be formed in selected locations on the die 100 that are exposed to larger stresses and strains, where electrical communications may need to be stronger, or both such that a useful lifespan of the die 100 is increased when in use. For example, at corners of the die 100 or near edges of the die 100 the flexure or bending of the die due to expansion and contraction may more likely cause cracks in solder at these locations. Accordingly, the first conductive structures 114 may be positioned at corners of the die 100 whereas the second conductive structures 116 may be positioned closer to a center of the die 100.

Unlike the conventional semiconductor dies with solder bumps and conductive structures that are all the same, the first solder portions 118 and the second solder portions 120 on the conductive structures 114, 116 of the die 100 are of different size, shape, and profile relative to each other. However, similar to the conventional solder bumps in the conventional semiconductor die that have points furthest away from the conventional semiconductor die that are all coplanar with each other, the first solder portions 118 and the second solder portions 120 have points furthest away from the substrate 102 of the die 100 such that these points are all coplanar with each other along line 121, which can be seen in FIG. 1A. Accordingly, when the solder portions 118, 120 are coupled to a PCB or an ASIC die, the standoff height between the die 100 and the PCB or ASIC die remains consistent and the die 100 is not an angle with respect to the PCB or the ASIC die.

Generally, some alternative conventional semiconductor die than those discussed directly above have a plurality of conventional first conductive structures having a size and a shape that differs from a plurality of conventional second conductive structures. The conventional first conductive structures and the conventional second conductive structures generally do not have openings extending through them and, instead, all have a cylindrical shape. The conventional first conductive structures are generally larger than the conventional second conductive structures. Conventional first solder portions are coupled to the conventional first conductive structures and the conventional first solder portions are generally larger than conventional second solder portions coupled to the conventional second conductive structures. However, the conventional first solder portions and the conventional second solder portions are generally all solder bumps. These conventional solder structures and conventional solder portions of the alternative conventional semiconductor die generally have a relative large amount of variation between respective points of the conventional solder portions that are desired to be co-planar with each other relative to the solder portions 118, 120 of the die 100.

Unlike the alternative conventional semiconductor die, the first solder portions 118, which have the ring-shape, and the second solder portions 120, which may be solder bumps and have a hemi-spherical shape, have points furthest away from the substrate 102 such that the points are co-planar along line 121 as shown in FIG. 1A. Accordingly, the standoff height of the die 100 remains consistent when the die 100 is coupled to the PCB. In other words, the die 100 is not an angle with respect to a surface of the PCB to which the die 100 is coupled utilizing the first solder portions 118 and the second solder portions 120. Accordingly, the variation in the conventional solder portions of the alternative conventional semiconductor die results in the standoff height that is less consistent when the alternative conventional semiconductor die is coupled to a PCB or an ASIC die when compared to the die 100 being coupled to a PCB or an ASIC die.

FIGS. 3A-3H are various cross-sectional views of steps of a method of manufacturing the die 100 as shown in FIGS. 1A-1D. Features similar to those as shown in FIGS. 1A-1D that are in FIGS. 3A-3H will not be re-described in detail for brevity and simplicity.

Figure 3A:
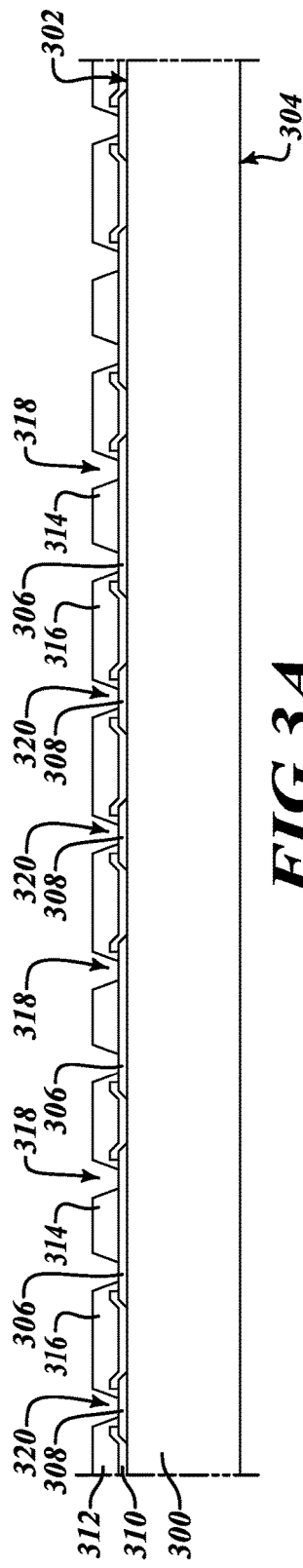
FIGS. 3A-3I show a flowchart of an embodiment of a method of manufacturing the embodiment of the die as shown in FIGS. 1A-1D.

FIG. 3A is a cross-sectional view of a wafer 300 having a first surface 302 and a second surface 304 opposite to the first surface 302. A plurality of first conductive layers 306 and a plurality of second conductive layers 308 are formed on the first surface 302 of the wafer 300. The first and second conductive layers 306, 308 may be formed by a sputtering technique, a photo-resist patterning technique, a vapor deposition technique, an etching technique, or some other technique or combination of techniques to form and pattern a layer of conductive material.

For example, the conductive layers 306, 308 may be formed by sputtering a conductive material on the first surface 302 to cover the first surface 302. After sputtering, a photoresist material is formed on the conductive material and is patterned to have openings at locations where the conductive material is to be removed. A chemical etchant is then applied to the patterned photoresist layer and the chemical etchant enters the openings in the patterned photoresist to remove portions of the conductive material that are exposed by the openings. This patterns the conductive material to form the conductive layers 306, 308. Once the conductive layers 306, 308 are formed, the patterned photoresist material is removed exposing the first and second conductive layers 306, 308. The first conductive layers 306 correspond to the first contact pads 104 in the die 100. The second conductive layers 308 correspond to the second contact pads 106 of the die 100.

Once the first and second conductive layers 306, 308 are formed a first nonconductive layer 310 is formed on the first surface 302 of the wafer 300 and on ends of the first and the second conductive layers 306, 308. The first nonconductive layer 310 is formed in a similar fashion as discussed above with respect to the formation of the first and second conductive layers 306, 308. However, unlike the formation of the first and second conductive layers 306, 308, a chemical etchant is applied that is configured to remove portions of the first nonconductive layer 310 instead of the first and second conductive layers 306, 308. The first nonconductive layer 310 corresponds to the first nonconductive layer 108 of the die 100 as shown in FIGS. 1A-1D.

Once the first nonconductive layer 310 is formed and patterned, a second nonconductive layer 312 is formed. The second nonconductive layer 312 is formed in a similar fashion as discussed earlier with respect to the formation of the first and second conductive layers 306, 308. However, unlike the formation of the first and second conductive layers 306, 308, a chemical etchant is applied that is configured to remove portions of the second nonconductive layer 312 instead of the first and second conductive layers 306, 308. The second nonconductive layer 312 includes a plurality of first portions 314 and a second portion 316. Each first portion is centrally located on each second conductive layer 308. The first portion 314 has a substantially circular shape, which can be seen in FIG. 3B.

A plurality of first openings 318 and a plurality of second opening 320 are formed when the chemical etchant is applied to the second nonconductive layer 312 to remove portions of the second nonconductive layer 312. These portions are selectively removed through the use of a temporary photoresist layer that is formed on the second nonconductive layer 312 and is patterned such that the chemical etchant forms the first openings 318 and the second openings 320. The temporary photoresist is then removed after the first openings 318 and the second openings 320 are formed.

Each first portion 314 is surrounded by a corresponding one of the first openings 318 that have a ring-shape. The second portion 316 of the second nonconductive layer 312 makes up the majority of the second nonconductive layer 312 and surrounds the first openings 318 and the first portions 314. The second nonconductive layer 312 will form the second nonconductive layer 110 of the die 100. The first portions 314 correspond to the first portion 128 of the second nonconductive layer 110, and the second portion 316 corresponds to the second portion 129 of the second nonconductive layer 110 as shown in FIGS. 1A-1D of the die 100. Each one of the first openings 318 exposes a corresponding one of the first conductive layers 306. Each one of the second openings 320 exposes a corresponding one of the second conductive layers 308.

A plurality of second openings 320 extend into the second portion 316 of the second nonconductive layer 312. The second openings 320 are substantially circular in shape, which can be seen in FIG. 3B. Each of the second openings 320 exposes a corresponding one of the conductive layers 308.

Figure 3B:
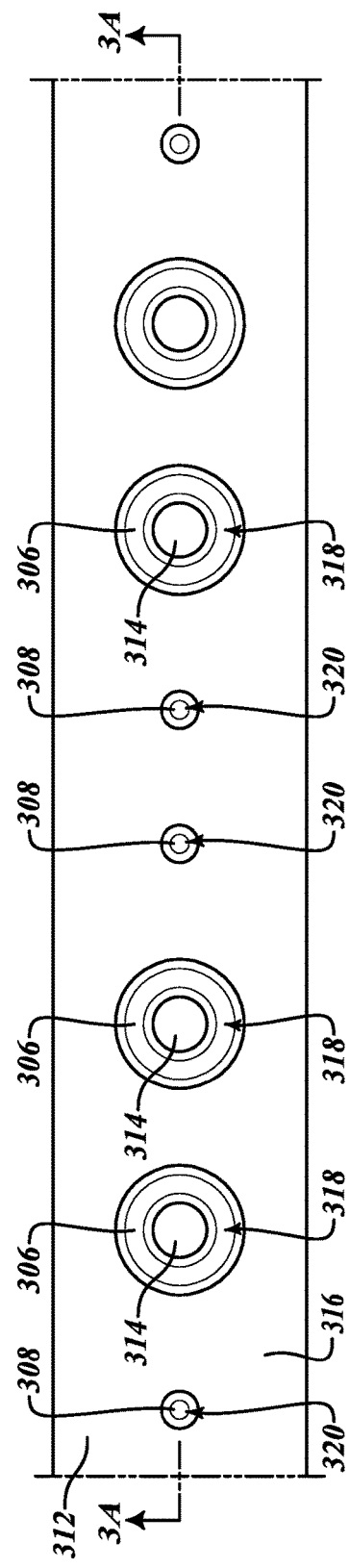

FIG. 3B is a top-plan view of the wafer 300 with the first conductive layers 306, the second conductive layers 308, the first nonconductive layer 310, and the second nonconductive layer 312 on the wafer. The top-plan view of the wafer 300 shows the first portions 314 having the substantially circular shape, the first openings 318 having the substantially ring-shape, and the second openings 320 having the substantially circular shape. In some embodiments, the ring-shape of the first openings 318 may be substantially rectangular, square, ovular, or some other shape. In some embodiments, the first portion may be substantially rectangular, square, ovular, or some other shape or combination of shapes. In some embodiments, the second openings 320 may be substantially square, rectangular, square, triangular, or some other shape or combination of shapes.

Figure 3C:
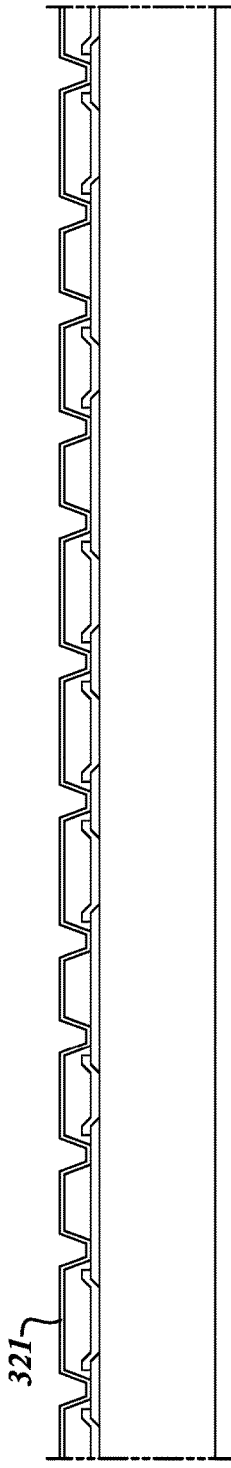

After the first conductive layers 306, the second conductive layers 308, the first nonconductive layer 310, and the second nonconductive layer 312 are formed on the wafer 300, a third conductive layer 321 is formed on the wafer 300 as seen in FIG. 3C. The third conductive layer 321 is formed in the similar manner as discussed with respect to forming the first and second conductive layers 306, 308. However, unlike the formation of the first and second conductive layers 306, 308, in which the conductive material is patterned to form the first and second conductive layers 306, 308, the third conductive layer 321 is sputtered onto the second nonconductive layer 312 and is not patterned. The third conductive layer 321 covers the first portions 314 and the second portion 316 of the second nonconductive layer 312, and partially fills the first and second openings 318, 320 in the second nonconductive layer 312.

Figure 3D:
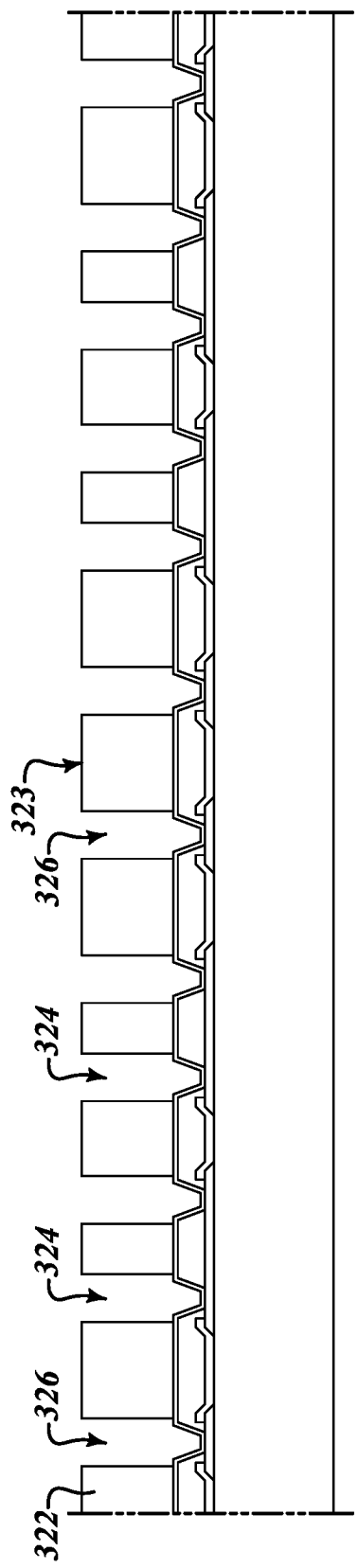

After the third conductive layer 321 is formed on the wafer 300 as shown in FIG. 3C, a first temporary layer 322 is formed on the third conductive layer 321 in a similar manner as discussed above with respect to the first nonconductive layer 310 as shown in FIG. 3D. The first temporary layer 322 has a surface 323 that faces away from the wafer 300. The first temporary layer 322 may be a photoresist material, an insulating material, a dielectric material, or some other nonconductive material.

A plurality of first openings 324 are formed in the first temporary layer 322. Each of the first openings 324 in the first temporary layer 322 is aligned with a corresponding one of the first openings 318 in the second nonconductive layer 312. The first openings 324 may be formed in a similar fashion as the first and second openings 318, 320 in the second nonconductive layer 312. Alternatively, the first openings 324 may be formed by drilling, etching, or some other formation technique capable of forming openings in the temporary layer 322. Each of the first openings 324 of the first temporary layer 322 expose a portion of the third conductive layer 321 that is within each of the first openings 318 in the second nonconductive layer 312. The first openings 324 in the first temporary layer 322 have the substantially ring-shape similar to the first openings 318 in the second nonconductive layer 312.

A plurality of second openings 326 are formed in the first temporary layer 322. Each of the second openings 326 in the first temporary layer 322 is aligned with a corresponding one of the second openings 320 in the second nonconductive layer 312. The second openings may be formed in a similar fashion as the first and second openings 318, 320 in the second nonconductive layer 312. Alternatively, similar to the first openings 324, the second openings 326 may be formed by drilling, etching, or some other formation technique capable of forming openings in the temporary layer 322. Each of the second openings 326 in the first temporary layer 322 expose a portion of the third conductive layer 321 that is aligned with each of the second openings 320 in the second nonconductive layer 312. The second openings 326 in the first temporary layer 322 have the substantially circular shape similar to the second openings 320 in the second nonconductive layer 312.

Figure 3E:
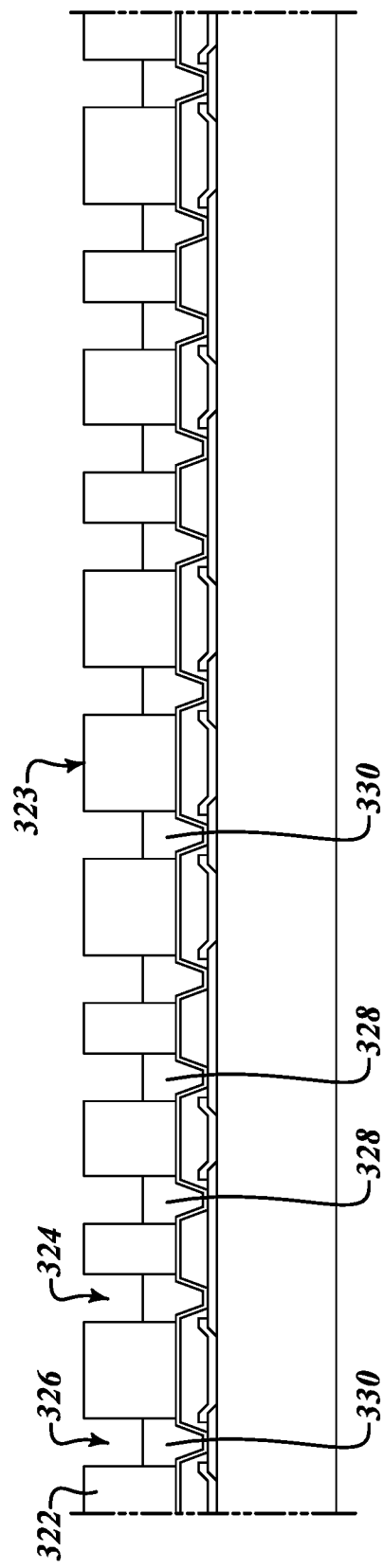

After the first temporary layer 322 is formed and patterned to have the first openings 324 and the second openings 326 as shown in FIG. 3D, a conductive material is formed in the first openings 324 and the second openings 326 in the first temporary layer 322 as shown in FIG. 3E. The conductive material forms first conductive structures 328 in the first openings 324 and second conductive structures 330 in the second openings 326. The first conductive structures 328 correspond to the first conductive structures 114 in the die 100, and the second conductive structures 330 correspond to the second conductive structures 116 of the die 100.

The conductive material forming the first and second conductive structures 328, 330 may be formed through an electro-plating technique. In this electro-plating technique, the third conductive layer 321 is a seed layer to which the conductive material is attracted and the first temporary layer 322 is a photoresist layer. The first temporary layer 322 with the openings 324, 326 act as a guide to position the conductive material on the third conductive layer 321 to form the first and second conductive structures 328, 330 in this electro-plating technique. When the electro-plating technique is utilized, the wafer 300 with the first temporary layer 322 having the openings 324, 326 is placed in a liquid solution including the conductive material. An electrical current is passed through the liquid solution that causes the conductive material to be attracted to the third conductive layer 321. The conductive material then builds up in the openings 324, 326 and on the third conductive layer 321, which results in the formation of the conductive structures 328, 330.

Figure 3F:
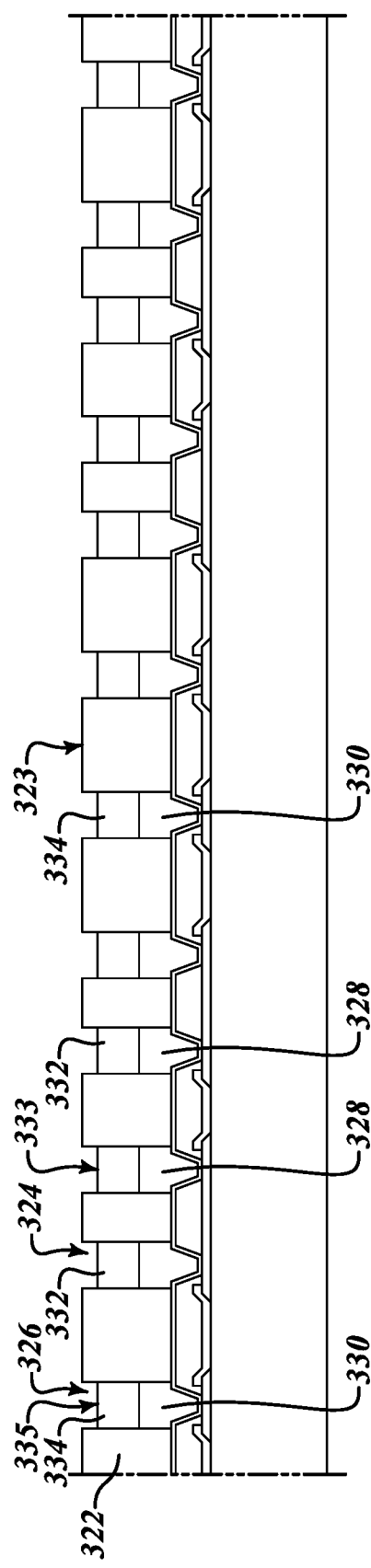

After the conductive structures 328, 330 are formed as shown in FIG. 3E, a solder material is formed in the openings 324, 326 and on the conductive structures 328, 330 to form first solder portions 332 and second solder portions 334 as shown in FIG. 3F. The solder material is deposited into the openings 324, 326. The first solder portions 332 each have a surface 333 that is within one of the first openings 324 and that is below the surface 323 of the first temporary layer 322 based on the orientation as shown in FIG. 3F. The second solder portions 334 each have a surface 335 that is within one of the second openings 326 and is below the surface 323 of the first temporary layer 322 based on the orientation in FIG. 3F. The solder material may be deposited utilizing an injection technique such as injection molded solder (IMS) technique.

The amount of solder placed in the first openings 324 may differ from the amount of solder placed in the second openings 326. The amount or volume of solder in the first openings relative to the second openings may be selected based on taking into consideration solder cohesive force between the solder and the first and second conductive structures 328, 330 and dimensions of the first and second conductive structures 328, 330 (e.g., height, base, width, length, etc.) as well as other factors. This selection of volume of solder placed on the first conductive structures 328 relative to the volume of solder placed on the second conductive structures 330 allows for the first and second solder portions 114, 116 in FIG. 1A to have points furthest away from the substrate 102 of the die 100 to be coplanar with each other along the line 121 after the solder portions 332, 334 are reflowed as will be discussed in detail with respect to FIG. 3H.

In some embodiments, the solder material may be formed by overfilling the openings 324, 326 such that excess solder material is on the surface 323 of the first temporary layer 322. The excess solder material on the surface 323 is then removed utilizing a squeegee or some other mechanism to remove the excess solder. If this overfill technique is utilized to form the solder portions 332, 334 the surfaces 333, 335 of the solder portions 332, 334 are co-planar or flush with the surface 323 of the first temporary layer 322.

After the solder material is formed in the openings 324, 326 and on the conductive structures 328, 330, the solder material is allowed to cure. Each of the first solder portions 332 have the substantially ring-shape of the first opening 318. Each of the second solder portions 334 have a substantially circular shape as the second opening 320. In other words, the second solder portions 334 have a substantially cylindrical shape.

Figure 3G:
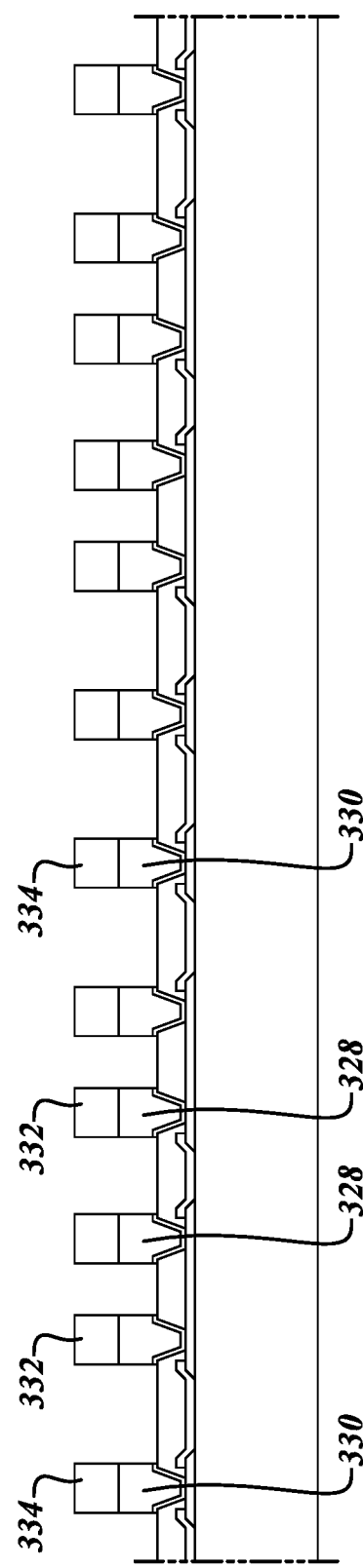

After the first solder portions 332 and the second solder portions 334 are cured and hardened as shown in FIG. 3F, the first temporary layer 322 is removed and the third conductive layer 321 is patterned as shown in FIG. 3G. The first temporary layer 322 may be removed and the third conductive layer 321 may be patterned at the same time utilizing the same technique. For example, the first temporary layer 322 and the third conductive layer 321 may be removed utilizing a chemical etching, a water jet removal technique, a drilling technique, or some other removal technique or combination of removal techniques. Alternatively, the first temporary layer 322 may first be removed by one of the above listed techniques, and then the third conductive layer 321 may be patterned utilizing one of the above listed techniques after the first temporary layer 322 has been removed.

Figure 3H:
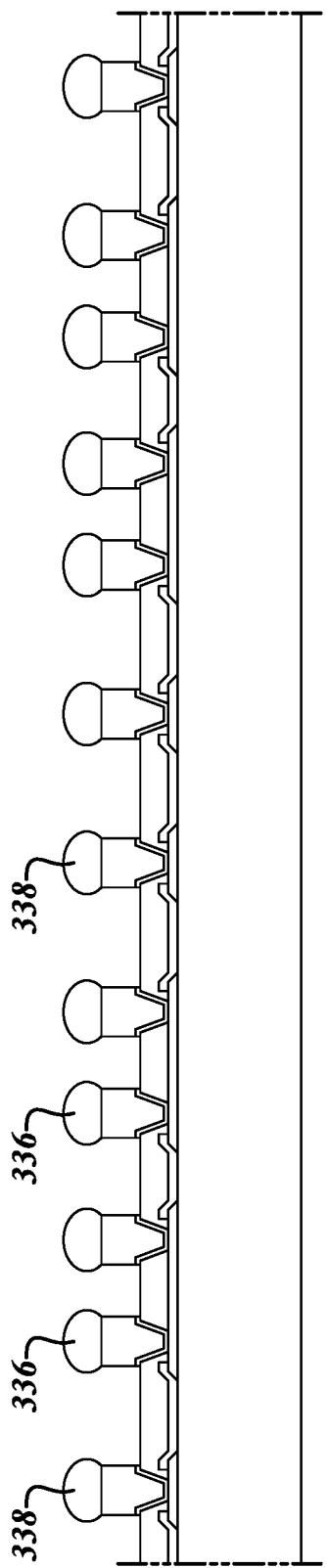
Figure 3I:
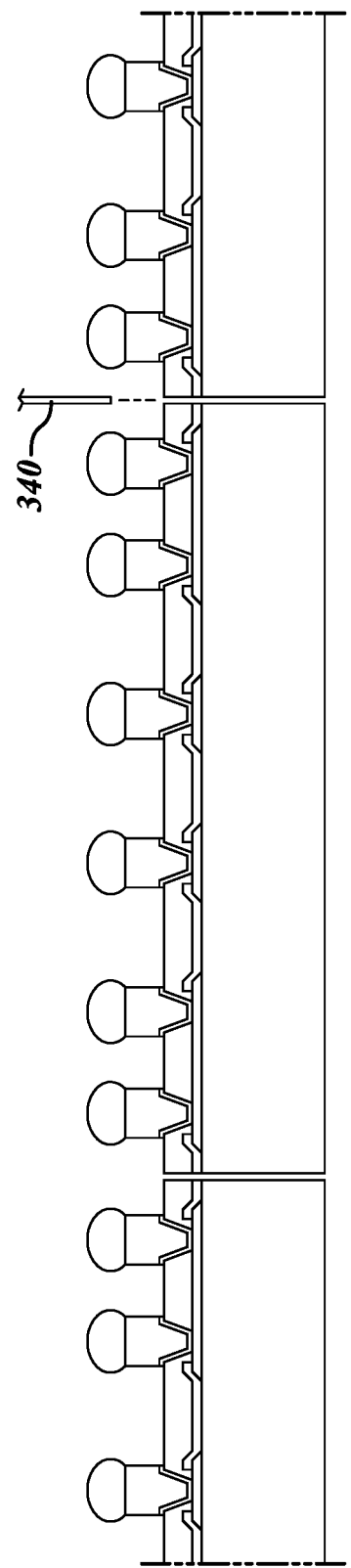

After the solder portions 332, 334 are formed, the first temporary layer 322 is removed, and the third conductive layer 321 is patterned as shown in FIG. 3G, the solder portions 332, 334 are reflowed to form a plurality of ring-shape solder portions 336 and a plurality of solder balls 338 as shown in FIG. 3I. Each of the plurality of ring-shape solder portions 336 is on one of the first conductive structures 328, and each of the plurality of solder balls 338 is on one of the second conductive structures 330. The ring-shape solder portions 336 correspond to the first solder portions 118 of the die 100, and the solder balls 338 correspond to the second solder portions 120 of the die 100 as shown in FIG. 1A. The solder portions 332, 334 may be reflowed in a reflow oven at a peak temperature between 245-265° C. This reflow process rounds the solder portions 332, 334 such that they have a hemi-spherical shape in a cross section as shown in FIG. 3G.

After the ring-shape solder portions 336 and the solder balls 338 are formed through the reflow process as shown in FIG. 3H, the wafer 300 and the various components formed on the wafer 300 as shown in FIG. 3A-3H is singulated by a singulation tool 340 into individual die 100 as shown in FIG. 1A.

FIGS. 4A-4B show some steps of an alternative method of manufacturing the die 100 as shown in FIG. 1A. For simplicity and brevity sake, only the differences between this alternative method of manufacturing in FIGS. 4A-4B and the method of manufacturing in FIGS. 3A-3I will be discussed in detail.

This alternative method of manufacturing is the same as the method of manufacturing in FIGS. 3A-3I except that in this alternative method of manufacturing the die 100, the conductive structures 328, 330 are not formed at the same time in the same step as in FIG. 3E. Instead, a plurality of first conductive structures 342 and first solder portions 344 are formed in the similar fashion as the second conductive structures 330 as shown in FIG. 3D-3F; and after these first conductive structures 342 and first solder portions 344 are formed, a second temporary layer 346 is formed on the third conductive layer 321 and is patterned with openings 348 that are substantially ring-shape. This second temporary layer 346 is formed and patterned with the openings 348 in a similar fashion as the first temporary layer 322 as discussed above in the method shown in FIGS. 3A-3I. The second temporary layer 346 may be a photoresist material, an insulating material, a dielectric material, or some other nonconductive material. The second temporary layer 346 covers surfaces 350 of the first solder portions 344 on the first conductive structures 342. The openings 348 expose the third conductive layer 321 and an electro-plating process is then completed to form the second conductive structures 352 in the same manner as the electro-plating step as discussed with respect to FIG. 3E. After the second conductive structures 352 are formed, a plurality of second solder portions 354 are formed in the openings 348 and on the second conductive structures 352 in a similar fashion as the first conductive structures 328 and the first solder portions 332 as discussed above with respect to FIGS. 3D-3F.

FIG. 5A-5B shows steps in an alternative method of manufacturing the die 100. FIG. 5A illustrates solder portions 354, 356 being formed on conductive structures 358, 360 by overfilling openings in a temporary layer 362 such that excess solder material is on a surface 364 of the temporary layer 362. The excess solder material on the surface 364 is then removed utilizing a squeegee or some other mechanism to remove the excess solder from the surface 364. When this overfill technique is utilized to form the solder portions 354, 356, surfaces 366, 368 of the solder portions 354, 358 are co-planar or flush with the surface 364 of the temporary layer 362 as shown in FIG. 5A. FIG. 5B shows the result of after the temporary layer 362 has been removed. The temporary layer 362 may be removed utilizing a chemical etching, a water jet removal technique, a drilling technique, or some other removal technique or combination of removal techniques. The temporary layer 362 may be a photoresist material, an insulating material, a dielectric material, or some other nonconductive material. Otherwise, this alternative method of manufacturing the die 100 is similar to the method of manufacturing the die 100 as discussed with respect to FIGS. 3A-3I.

Generally, conventional methods of forming the alternative conventional semiconductor die with the conventional first conductive structures that are larger than the conventional second conductive structures as discussed above with respect to the advantages of the die 100 are more costly than the method disclosed in FIGS. 3A-3I to form the die 100. In the conventional method, the conventional first conductive structures and the conventional first solder portions coupled to the first conductive structures are formed utilizing a first conventional photoresist layer that is patterned with openings to form the conventional first conductive structures and the conventional first solder portions. After the conventional first conductive structures and the conventional first solder portions are formed, the first conventional photoresist layer is removed and a second conventional photoresist layer is formed with openings and covers the conventional first conductive structures and the conventional first solder portions. The conventional second conductive structures and the conventional second solder portions are then formed utilizing the openings in the second conventional photoresist layer.

However, unlike the conventional method of forming the alternative conventional semiconductor die with differing sized conductive structures, the method of forming the die 100 in FIGS. 3A-3I forms the first conductive structures 328 and the second conductive structures 330 at the same time in openings 324, 326 in the first temporary layer 322. The first solder portions 332 and the second solder portions 334 are then formed on the conductive structures 328, 330 at the same time after the conductive structures 328, 330 are formed. By forming the first and second conductive structures 328, 330 at the same time and the first and second solder portions 332, 334 at the same time, the number of steps to form the die 100 is significantly reduced when compared to the method of forming the alternative conventional semiconductor die, and the cost of forming the die 100 is less than forming the alternative conventional semiconductor die.

Unlike the conventional method of forming the alternative conventional semiconductor die, less conductive material relative to the formation of the conventional first conductive structures is used to form the first conductive structures 328 since portions of the first temporary layer 322 are on the first portions 314 of the second nonconductive layer 312. Accordingly, this generally reduces the cost of manufacturing the die 100 relative to the alternative conventional semiconductor die.

However, like the conventional method of forming the alternative conventional semiconductor die with differing sized conductive structures, the techniques to form the first and second conductive structures 328, 330 and the first and second solder portions 332, 334 are relatively similar to each other allowing for machines utilized to form the alterative conventional semiconductor die to be easily reconfigured or reprogrammed to form the die 100 in FIG. 1A.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate having a first surface;
a ring-shaped conductive structure on the substrate, the ring-shaped conductive structure extending away from the substrate, the ring-shaped conductive structure including:
a second surface facing away from the substrate;
an opening extending towards the substrate;
an interior sidewall that surrounds the opening;
an exterior sidewall that surrounds the opening, the interior sidewall, and the second surface; and
a first diameter; and
a cylindrical conductive structure on the substrate, the cylindrical conductive structure extending away from the substrate, the cylindrical conductive structure is spaced apart from the ring-shaped conductive structure, and the cylindrical conductive structure including a second diameter less than the first diameter.

2. The device of claim 1, wherein the second surface of the ring-shaped conductive structure extends between and separates the interior sidewall and the exterior sidewall.

3. The device of claim 1, wherein a ring-shaped solder portion is on the second surface of the ring-shaped conductive structure.

4. The device of claim 1, wherein the cylindrical conductive structure includes:
a third surface facing away from the substrate; and
an exterior sidewall that surrounds the third surface.

5. The device of claim 4, wherein:
the ring-shaped conductive structure has a first dimension extending between the first surface and the second surface; and
the cylindrical conductive structure has a second dimension extending between the first surface and the third surface, the second dimension being substantially equal to the first dimension.

6. The device of claim 4, wherein the substrate further comprises:
a first contact pad on the first surface of the substrate, the first contact pad having a fourth surface with a first area, the first contact pad coupled to the ring-shaped conductive structure; and
a second contact pad on the first surface of the substrate, the second contact pad having a fifth surface with a second area, the second contact pad coupled to the cylindrical conductive structure.

7. The device of claim 1, wherein the opening exposes a contact pad of the substrate.

8. A device, comprising:
a die including:
a substrate having a first surface;
a first conductive structure on the first surface, the first conductive structure extending away from the first surface and including:
a second surface spaced apart from the first surface by a first dimension extending between the first surface and the second surface;
an opening in the first conductive structure;
a first wall surrounding the opening; and
a first diameter; and
a second conductive structure on the first surface, the second conductive structure extending away from the first surface and including:
a third surface spaced apart from the first surface by a second dimension extending between the first surface and the third surface, the second dimension being substantially equal to the first dimension; and a second diameter being less than the first diameter;

a first solder portion on the second surface of the first conductive structure, the first solder portion including:
  a first point furthest away from the second surface; and
  a third dimension extending from the second surface to the first point;

a second solder portion on the third surface of the second conductive structure, the second solder portion including:
  a second point furthest away from the third surface; and
  a fourth dimension extending from the third surface to the second point, the fourth dimension being substantially equal to the third dimension; and an electrical component including:
  a first contact having a fourth surface with a first area, the first contact coupled to the first solder portion; and
  a second contact having a fifth surface with a second area, the second contact coupled to the second solder portion, the second area is less than the first area.

9. The device of claim 8, wherein the second surface being substantially ring-shaped.

10. The device of claim 8, wherein the third surface being substantially circular shaped.

11. The device of claim 8, wherein the die further comprises:
  a first contact pad on the first surface of the substrate, the first contact pad having a fourth surface with a first area, the first contact pad coupled to the first conductive structure; and
  a second contact pad on the first surface of the substrate, the second contact pad having a fifth surface with a second area, the second contact pad coupled to the second conductive structure, the second area being less than the first area.

12. A method, comprising:
  forming a ring-shaped conductive structure with a first diameter on a first contact pad of a substrate by:
    forming a first conductive material on the first contact pad, the first conductive material including an exterior wall and an interior wall surrounding an opening;
  forming a cylindrical conductive structure with a second diameter on a second contact pad of the substrate;
  forming a first solder material on the ring-shaped conductive structure, the first solder material being ring-shaped; and
  forming a second solder material on the cylindrical conductive structure, the second solder material being a solder ball.

13. The method of claim 12, wherein:
  forming the first solder material on the ring-shaped conductive structure includes forming a first point of the first solder material furthest away from the ring-shaped conductive structure; and
  forming the second solder material on the cylindrical conductive structure includes forming a second point of the second solder material furthest away from the cylindrical conductive structure, and the second point is level and coplanar with the first point.

14. The method of claim 12, wherein forming the ring-shaped conductive structure on the first contact pad of the substrate further comprises:
  forming a photoresist material with an opening exposing a conductive layer coupled to the first contact pad of the substrate; and
  forming the first conductive material partially filling the first opening.

15. The method of claim 14, further comprising forming a solder material on the ring-shaped conductive structure further comprising forming the solder material on the first conductive material in the first opening.

16. The method of claim 12, further comprising:
  forming a solder material on the ring-shaped conductive structure;
  coupling the solder material to a contact of an electrical component; and
  forming a molding compound on the substrate and the electrical component, the molding compound encasing the substrate.

17. A device, comprising:
  a substrate having a first surface;
  a non-conductive layer on the first surface of the substrate;
  a ring-shaped conductive structure on the substrate, the ring-shaped conductive structure extending away from the substrate, the ring-shaped conductive structure including:
    a second surface facing away from the substrate;
    an opening extending towards the substrate, the opening exposes the non-conductive layer on the first surface of the substrate;
    an interior sidewall that surrounds the opening; and
    an exterior sidewall that surrounds the opening, the interior sidewall, and the second surface; and
  a cylindrical conductive structure on the substrate, the cylindrical conductive structure extending away from the substrate.

18. The device of claim 17, further comprising the cylindrical-shaped conductive structure is spaced apart from the ring-shaped conductive structure.

* * * * *